United States Patent [19]

McCormick et al.

[11] Patent Number: 4,828,512
[45] Date of Patent: May 9, 1989

[54] CONNECTOR FOR FLAT ELECTRICAL CABLES

[75] Inventors: Larry L. McCormick, Los Angeles; Thomas A. Clark, Santa Monica, both of Calif.

[73] Assignee: G & H Technology, Inc., Santa Monica, Calif.

[21] Appl. No.: 911,962

[22] Filed: Sep. 25, 1986

[51] Int. Cl.⁴ .............................................. H01R 9/07
[52] U.S. Cl. ...................................... 439/495; 439/88
[58] Field of Search ............ 339/17 F, 17 M, 17 LM, 339/176 MF, 59 M, 61 M, DIG. 3; 439/492–499, 88, 67, 77

[56] References Cited

U.S. PATENT DOCUMENTS 3,613,049 10/1971 Niedzwiecki ................ 339/176 MF
3,904,934 9/1975 Martin ............................. 339/17 M
4,146,291 3/1979 Goff et al. ............................ 339/211
4,421,370 12/1983 Treakle et al. ..................... 339/17 M
4,610,495 9/1986 Landi ................................. 339/17 F

FOREIGN PATENT DOCUMENTS 570712 12/1975 Switzerland .................. 339/DIG. 3

Primary Examiner—Neil Abrams
Attorney, Agent, or Firm—George J. Netter

[57] ABSTRACT

The invention is directed to a connector for two flat electrical cables having the same plurality of conduits. The electricity passes from one conduit to the corresponding conduit by way of a dielectric insert having holes therethrough, with electrically conductive means having at least a portion of a hemispherical surface protruding on each side of the dielectric insert. Preferably pressure is applied to the cable/insert/cable sandwich quasi-hydrostatically through a low durometer elastomeric materic material. For EMI/EMP shielding, the low durometer elastomeric material is electrically conductive and encloses completely the connection.

3 Claims, 3 Drawing Sheets (SECTION B-B)

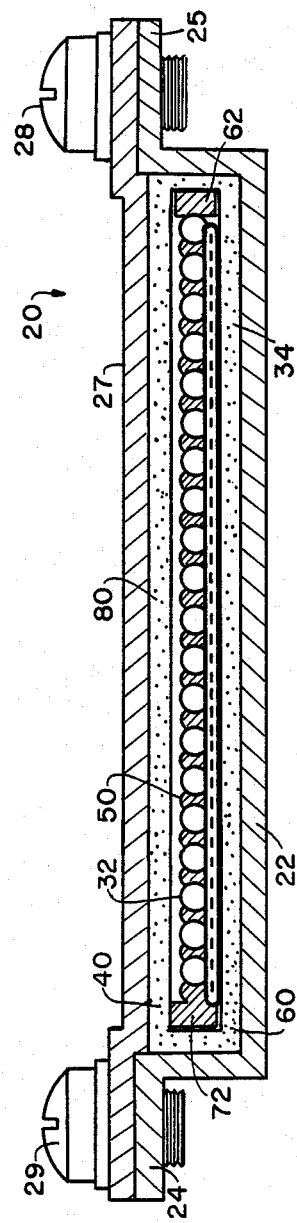
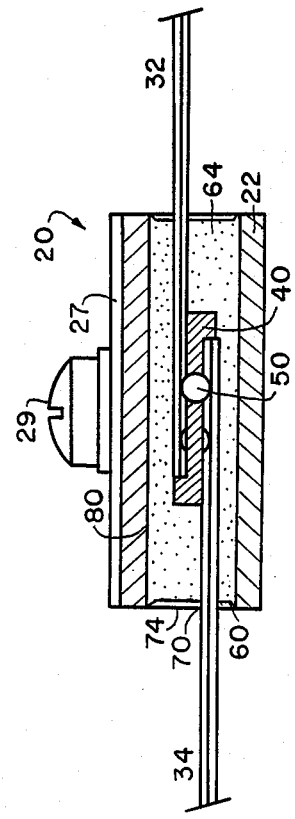

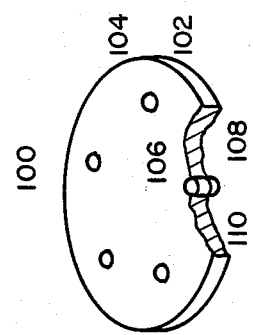
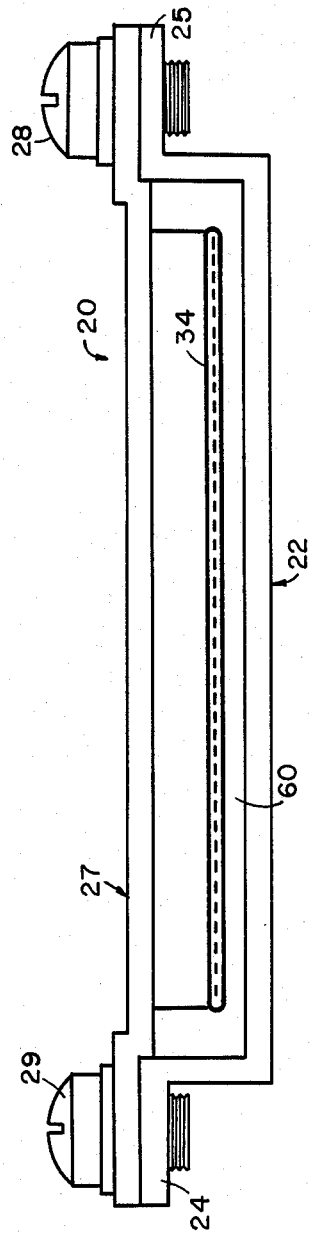
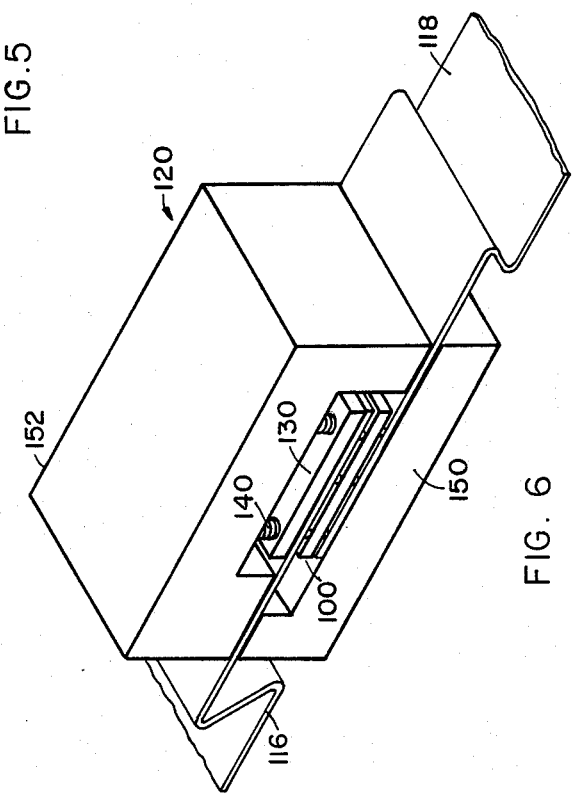

CONNECTOR FOR FLAT ELECTRICAL CABLES

BACKGROUND OF THE INVENTION

1. Field of the Invention

The instant invention relates to a connector capable of readily connecting, demounting and reconnecting two flat plural electrical cables.

2. Description of the Prior Art

Illustrative of electrical cable connectors of interest for connecting two cables each having a plurality of electrical conduits are Reardon II U.S. Pat. No. 4,125,310, issued Nov. 14, 1978 on an application filed Dec. 1, 1975 and Moulin U.S. Pat. No. 4,453,795, issued June 12, 1984, on an application asserting an early filing date of Dec. 1, 1975.

OBJECTS OF THE INVENTION

One object of the invention is an electrical connector which permits easy connecting, demounting and reconnecting of two flat cables when inspection, replacement or addition of new parts is called for.

Another object of the invention is an electrical connector providing satisfactory electrical contact with a flat cable with only small pressure at the point of contact.

A further object of the invention is an electrical connector for two multi (polyplural) conduit or conductor flat cables providing certainty of electrical contact for each corresponding pair of conduits.

Still another object of the invention is an electrical connector which is capable of being shielded with respect to EMI and/or EMP disturbance.

Yet another object of the invention is an electrical connector which maintains electrical connection in two corresponding plural-conduit flat cables over a wide range of operating temperatures, below liquefaction point of the elastomeric material present therein.

Other objects of the invention will become evident from the detailed description thereof.

SUMMARY OF THE INVENTION

This invention is directed to a connector for two flat electrical cables, each cable having the same plurality of conduits. The connector of the invention comprises: (a) a planar dielectric insert (desirably made of a plastic material) having holes therethrough, said holes positioned to conform to the spacing of the two conduits to be electrically connected; (b) within each of said dielectric insert holes are electrically conductive means, held moveably therein, having at least a portion of a hemispherical surface protruding on each side of said dielectric insert; (c) on one side of said dielectric insert a support means, spaced apart from said adjacent hemispherical surfaces to receive a flat cable to be connected therein between; (d) on the other side of said dielectric insert pressure transmitting means, spaced apart from said hemispherical surfaces to receive another (a second) flat cable to be connected therein between; and (e) pressure means in contact with said pressure transmitting means to bring said hemispherical surfaces into electrical contact with the corresponding conduits of said flat cable conduits, when said two cables are placed within said connector.

Illustrative of the electrically conductive means, held movably within said holes in said insert, are spheres or elongated members having at each end at least a portion of a hemispherical surface, such as, rods and hollow cylinders, each of these elements having at each end a hemispherical surface. Desirably the defined electrically conductive elements are made of copper and, preferably, the copper surface has a noble metal coating, such as gold.

A preferred connector embodiment of the invention comprises: (1) a planar dielectric plastic material insert having holes therethrough, positioned to conform to the spacing of the conduits to be electrically connected; (2) held movably within each of said dielectric insert holes, electrically conductive spheres having at least a portion of a spherical surface protruding on each side of said dielectric insert; (3) on one side of said dielectric insert, a low durometer, elastomeric material, space apart from said adjacent spherical surfaces to receive a flat cable to be connected thereinbetween; (4) on the other side of said dielectric insert, a low durometer, elastomeric material, spaced apart of said adjacent spherical surfaces to receive a flat cable to be connected thereinbetween; (5) low durometer, elastomeric material arranged at both ends of said dielectric insert so that the said dielectric insert, and the two said cables are enclosed by low durometer, elastomeric material; and (6) means for applying pressure on said low durometer, elastomeric material to connect electrically, by way of said spheres, the corresponding conduits of said two flat cable conduits when said two cables are placed within said connector. Desirably, the means for applying pressure on said low durometer, elastomeric material is a spring means within a box which tightly encloses the aforedefined connector elements.

Preferably, the low durometer, elastomeric material has a durometer test hardness, type A, between about 15 and about 45.

For maximum EMI/EMP protection the low durometer, elastomeric material is electrically conductive; illustrative is conductive silicone rubber.

BRIEF DESCRIPTION OF THE DRAWINGS

FIG. 3 is a longitudinal side sectional view of this embodiment of the invention taken along section AA (see FIGS. 1–2) showing 20 spheres located in one line of the openings of the array shown in FIG. 2.

FIG. 4 is a side sectional view of this embodiment of the invention taken along section BB (see FIG. 2) showing the two 40-conduit flat cables connected through the spheres located in the array of openings.

FIG. 5 is a partial section along AA of FIG. 3 showing the lower of the two 40-conduit flat cables connected in this embodiment of this invention.

FIGS. 6 and 7 show another embodiment of the invention for connecting two 5-conduit flat cables through rods having hemispherical ends located in holes passing through a dielectric disk and protruding on each side of said insert (see FIG. 7).

FIG. 6 shows in partial section the electrical connection of the two flat cables and the container enclosing the connection.

DETAILED DESCRIPTION

Figure 2:
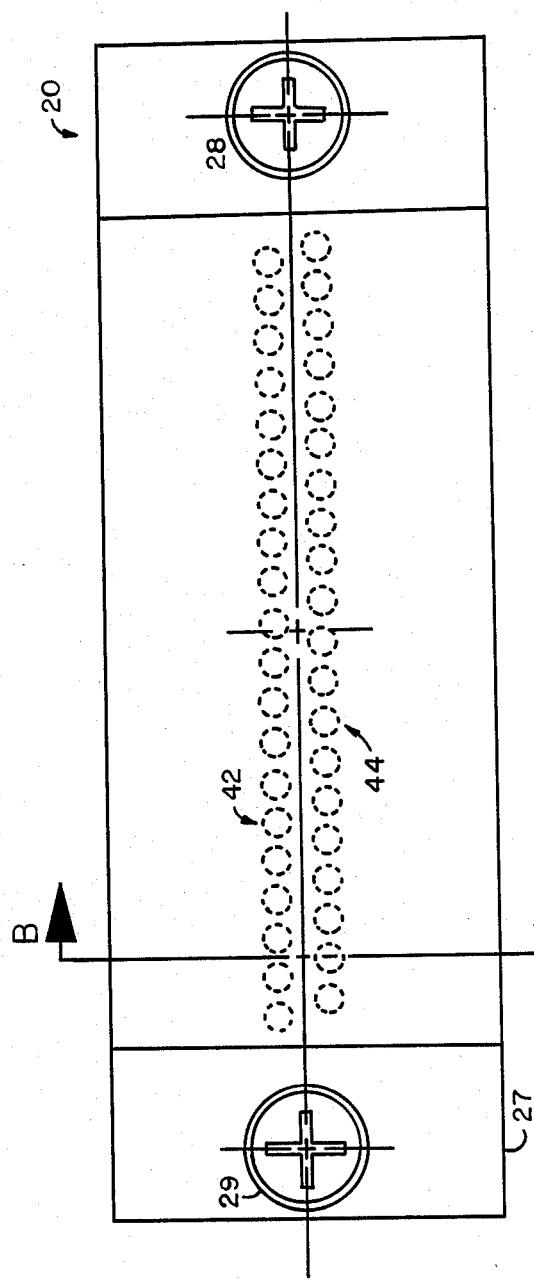
FIG. 2 is a longitudinal top view showing an array of 40 openings passing through an elongated planar dielectric insert at which two 40-conduit flat cables can be connected.
Figure 1:
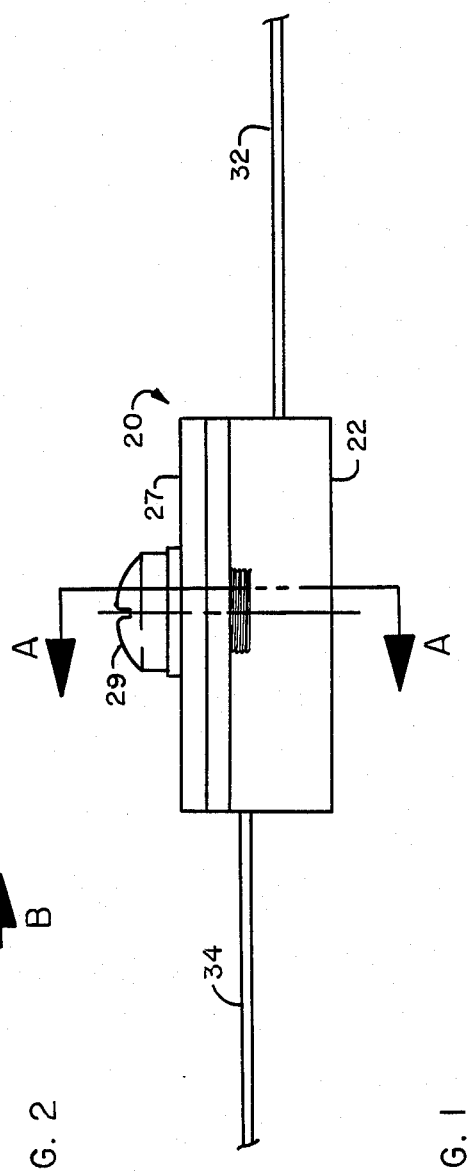
FIG. 1 is a side view of one embodiment of the invention showing two plural-conduit flat cables to be connected entering the connector.

FIGS. 1–5 set forth a preferred embodiment of the electrical connector of the invention. FIGS. 6–7 set forth another embodiment of the electrical connector of the invention.

FIGS. 1–5 show in one aspect or another a box 20 (container, housing, shell) which secures physically two 40-conduit flat electrical cables 32 and 34 (FIGS. 3 and 5). Box 20 comprises a lower portion 22 provided with shoulders 24 and 25. A cover 27 (lid) overlays portion 22 and is made a secure, tight physical fit by screws 28 and 29, each having a lockwasher, not numbered.

In this embodiment the two flat cables 32 and 34 have 40 corresponding electrical conduits: shielded flat-flex Raychem F/N EPD 5801, for example. The two corresponding flat cables have the same plurality of conduits (often such cables are called 'multicables').

The box 20 enclosing the two cable ends to be connected and the connecting elements may be made of any material strong enough to do the job. In this embodiment box 20 is made of aluminum alloy, for example, aluminum alloy 6061.

FIGS. 3–4 show an insert 40 which is a planar dielectric element an array of two parallel rows 42 of holes 44 therethrough (FIG. 2); each row has 20 holes. These holes 44 are positioned to conform to the spacing of the conduits in cables 32 and 34 to be electrically connected.

Electrical conductive means 50 have at least a portion of a hemispherical surface protruding on each side of said planar dielectrical insert 40. Each said conductive means 50 is held moveably within each of said holes 44; the conductive means 50 may rotate and move slightly up and down within the hole which maintains conductive means 50 captive. Each hole 44 has a cross-sectional shape to accommodate the cross-sectional shape of the respective conductive means 50. In this embodiment holes 44 are of circular cross section to accommodate spherical (balls) conductive means 50. Desirably conductive means 50 is made of copper (herein 'copper' includes 'copper alloys') and, preferably, has a noble metal coating, for example, of gold.

A support means 60 is positioned on one side of said dielectric insert 40. Support means 60 is spaced apart from the adjacent hemispherical surfaces of conductive means 50 in order to receive a flat cable 34 to be connected thereinbetween by conductive means 50.

A pressure transmitting means 70 is positioned on the other side of dielectric insert 40. Pressure transmitting means 70 is spaced apart from the adjacent hemispherical surfaces of conductive means 50 in order to receive a flat cable 32 to be connected therein between by conductive means 50.

When it is desired to enclose insert 40 completely, pressure means 60 and 70 maybe provided with extensions 62 and 72 and along with extensions 64 and 74. The area covered by 64 and 74 may be made large enough to function as strain relief areas.

Cover 27 through screws 28 and 29 functions to apply pressure on a conventional pressure means 80 (for example, a leaf spring compressed flat) in contact with pressure transmitting means 70 to bring the hemispherical surfaces of conductive means 50 into electrical contact with the corresponding conduits of the two flat cables 32 and 34, when these cables are placed within the connector 20.

Planar dielectric insert 40 may be made of any dielectric material of reasonable rigidity under normal conditions of use for the electrical connector. Desirably, insert 40 is made of a plastic material. Plastic materials include chemically modified natural rubbers, natural gums and resins, synthetic rubbers, higher softening point thermoplastic polymers and thermoset polymers. One preferred material are the acetal resins, such as those available commercially under the tradename, "Delrin".

FIGS. 6–7 set forth another embodiment of the invention. In FIG. 7 is set forth an interface wafer 100 comprising a circular dielectric insert 102 having 5 holes therethrough. Held movably within each of said holes 104 are elongated electrically conductive members 106 (for example, conductive pins, solid rods, hollow cylinders) which members 106 have at each end 108 at least a portion of a hemispherical surface 110. Although rods 106 may be of any cross-sectional shape and may be hollow or solid, a solid rod with the defined end configuration is usually selected for ease of manufacture. Preferably the defined rod is made of copper with a noble metal coating, typically, gold.

FIG. 6 shows two 5-conduit flexible flat electric cables 116 and 118 entering electrical connector 120, to be connected, which connector 120 is shown in partial cross-section. Interface wafer 100 is positioned centrally in the interior of connector 120. Cable 118 is located between wafer 100 with its conduits lined up with the lower hemispherical ends 110 of rods 106. Cable 116 is located between wafer 100 with its conduits lined up with the upper hemispherical ends of rods 106. Pressure plate 130 is positioned over the cable 116 inside connector 120. Spring members 140 apply pressure through plate 130 to the sandwich 'cable 116, interface wafer 100 and cable 118' to make the electrical connection. Connector 120 has outer enclosure members 150 and 152 which are adapted to afford the necessary connection pressure and environmental protection.

Desirably the spring members 140 are adapted to apply pressure to an individual conductive connecting member 106, rather than onto a pressure plate 130. Individualized pressure elements eliminate the possibility of incomplete electrical contact at particular conduits because of variation in size of the members 106 or variation in conduits, and the like, because of manufacturing size control problems.

A preferred embodiment of the connector of FIGS. 1–5 is set forth. The planar dielectric insert 40 is of the defined plastic material, preferably, 'Delrin' acetal resin. The electrically conductive means 50 are spheres; particularly, made of copper coated with fine gold. The insert 40, with spheres 50, is enclosed by a low durometer, elastomeric material, spaced apart from the spherical surfaces, that is, pressure means 60 and 70, extensions 62, 64, 72 and 74. Pressure means 80 in contact with pressure transmitting means 70 bring the protruding spherical surfaces 50 into electrical contact with the corresponding conduits of the two flat cables 32 and 34.

The low durometer, elastomeric material is desirably of a durometer test hardness, Type A, between about 15 and about 45; preferably on the order of 25–35.

The elastomeric material may be either a nonconductor or a conductor of electricity. Illustrative of a nonconductor elastomer is Santoprene 101-80, thermoplastic rubber (a neoprene rubber) of Monsanto Co.

When 360° shielding against EMI/EMP effects is wanted, the low durometer, elastomeric material is an electrical conductor material. The synthetic conductive elastomers are preferred, especially the silicone rubbers. Illustrative is SE65-ConSilicone rubber of Stockwell Rubber Co., Philadelphia, PA.

It has been observed that the defined low durometer, elastomeric material, when on both sides of the defined insert/hemispherical conductors, makes individual pressure contact with each hemispherical conductor by means of a quasi-hydrostatic loading effect. The low durometer, elastomeric material acts like a viscous fluid to transmit pressure to each electrical contact point, thus overcoming the usual adverse effects of contact point height differences inevitably present.

The quasi-hydrostatic behavior of the low durometer, conductive elastomeric material provides uninterrupted shielding and continuity between the connected cables, greatly improving the shielding against EMI-/EMP radiation.

It is self-evident that when using a conductive elastomeric material to surround the cable ends to be connected, the conduit insulation is stripped only from the ball contact side of the conduits, leaving the insulation on on the elastomer-side to bar current cross-over between conduits.

It has been observed that the preferred form of the spherical connector with the conductive silicone rubber having a durometer test hardness, Type A, of 25-35, requires an axial pull on the umbilical cable of about 90-200 Newtons to effect demounting of the 40-conduit cable, i.e, a pull of about 8 (eight) ounces, avoirdupois on each conduit connection. This represents a most satisfactory performance.

Thus having described the invention, what is claimed is:

1. A connector for two flat electrical cables each having the same plurality of individual conductors which are enclosed with an insulative material, except for one flat side of an end portion of each cable which has the insulative material removed leaving bare conductors exposed, comprising:

first and second metal shells which when fitted together form a hollow housing with first and second slots located on opposite sides of the housing, respectively, each of said slots having a length substantially equal to a cable width and a thickness such as to enable passage of a flat cable therethrough;

an elongated strip of insulative plastic having a plurality of openings arranged along the strip in a spaced-apart relation identical to that of the conductors in the flat cables, said openings each passing completely through the strip;

a plurality of highly conductive spheres having an outer diameter greater than the insulative plastic strip thickness, said conductive spheres being individually received within the strip openings with portions of each sphere extending outwardly of both sides of said strip;

a conductive elastomeric support means received in the first metal shell;

a conductive elastomeric pressue transmitting means received within the second metal shell;

a leaf spring located between the pressure transmitting means and the second metal shell;

the elongated strip with spheres in the strip openings being located within the first and second shells to establish conductor-to-conductor electrical paths between the bare conductor cable end portions received through the respective slots; and means for securing the first and second shells together clamping the pressure transmitting means, two flat cable bare end portions, elastomeric support means, strip with spheres, and leaf spring in a unitary arrangement.

2. A connector as in claim 1, in which each sphere is coated with a noble metal.

3. A connector as in claim 1, in which the elongated strip has front and back opposed end surfaces extending transversely thereof, the support means and pressure transmitting means having portions covering the strip front and back opposed end surfaces.

* * * * *